(12) United States Patent
Yang et al.

(10) Patent No.: US 11,895,780 B2
(45) Date of Patent: Feb. 6, 2024

(54) MANUFACTURING METHOD OF PACKAGE STRUCTURE

(71) Applicant: Unimicron Technology Corp., Taoyuan (TW)

(72) Inventors: Kai-Ming Yang, Hsinchu County (TW); Chen-Hao Lin, Keelung (TW); Wang-Hsiang Tsai, Taoyuan (TW); Cheng-Ta Ko, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 368 days.

(21) Appl. No.: 17/194,323

(22) Filed: Mar. 8, 2021

(65) Prior Publication Data
US 2021/0195761 A1  Jun. 24, 2021

Related U.S. Application Data

(60) Division of application No. 15/701,435, filed on Sep. 11, 2017, now abandoned, which is a
(Continued)

(30) Foreign Application Priority Data

Oct. 31, 2011   (TW) ................................. 100139667
Oct. 20, 2016   (TW) ................................. 105133848
Jul. 14, 2017   (TW) ................................. 106123710

(51) Int. Cl.
*H05K 3/46*   (2006.01)
*H05K 3/40*   (2006.01)
(Continued)

(52) U.S. Cl.
CPC ......... *H05K 3/4038* (2013.01); *H01L 21/486* (2013.01); *H01L 21/4846* (2013.01);
(Continued)

(58) Field of Classification Search
CPC ............ H01L 21/4846; H01L 21/4857; H01L 21/486; H01L 21/6835; H01L 21/76898;
(Continued)

(56) References Cited

U.S. PATENT DOCUMENTS 2,263,792 A    11/1941  Wood
3,681,374 A     8/1972  Yano et al.
(Continued)

FOREIGN PATENT DOCUMENTS

JP    2016213372 A   * 12/2016

OTHER PUBLICATIONS

Wee Ho et al., "Development of thin film dielectric embedded 3D stacked package", 2009 11th Electronics Packaging Technology Conference Year: 2009, pp. 185-190. (Year: 2009).*

*Primary Examiner* — A. Dexter Tugbang
(74) *Attorney, Agent, or Firm* — CKC & Partners Co., LLC

(57) ABSTRACT

A method of manufacturing package structures includes providing a carrier including a supporting layer, a metal layer, and a release layer between the supporting layer and the metal layer at first. Afterwards, a composite layer of a non-conductor inorganic material and an organic material is disposed on the metal layer. Then, a chip embedded substrate is bonded on the composite layer. Afterwards, an insulating protective layer having openings is formed on the circuit layer structure and exposes parts of the circuit layer structure in the openings. Afterwards, the supporting layer and the release layer are removed to form two package substrates. Then, each of the package substrates is cut.

5 Claims, 10 Drawing Sheets

Related U.S. Application Data continuation-in-part of application No. 15/391,861, filed on Dec. 28, 2016, now Pat. No. 11,127,664, which is a continuation-in-part of application No. 14/602,656, filed on Jan. 22, 2015, now Pat. No. 9,781,843, which is a division of application No. 13/604,968, filed on Sep. 6, 2012, now Pat. No. 8,946,564.

(51) Int. Cl.

| | |
|---|---|
| *H01L 23/538* | (2006.01) |
| *H01L 21/768* | (2006.01) |
| *H01L 21/48* | (2006.01) |
| *H05K 1/11* | (2006.01) |
| *H05K 1/18* | (2006.01) |
| *H05K 1/14* | (2006.01) |
| *H01L 23/14* | (2006.01) |
| *H01L 23/15* | (2006.01) |
| *H01L 23/498* | (2006.01) |
| *H01L 23/36* | (2006.01) |
| *H01L 23/00* | (2006.01) |
| *H01L 21/683* | (2006.01) |
| *H05K 1/02* | (2006.01) |

(52) U.S. Cl.
CPC ...... *H01L 21/4857* (2013.01); *H01L 21/6835* (2013.01); *H01L 21/76898* (2013.01); *H01L 23/147* (2013.01); *H01L 23/15* (2013.01); *H01L 23/36* (2013.01); *H01L 23/49822* (2013.01); *H01L 23/49827* (2013.01); *H01L 23/49838* (2013.01); *H01L 23/49894* (2013.01); *H01L 23/5389* (2013.01); *H01L 24/19* (2013.01); *H01L 24/20* (2013.01); *H05K 1/11* (2013.01); *H05K 1/112* (2013.01); *H05K 1/142* (2013.01); *H05K 1/183* (2013.01); *H05K 3/4644* (2013.01); *H05K 3/4673* (2013.01); *H01L 23/145* (2013.01); *H01L 23/49816* (2013.01); *H01L 2221/68345* (2013.01); *H01L 2221/68359* (2013.01); *H01L 2224/04105* (2013.01); *H01L 2224/131* (2013.01); *H01L 2224/16225* (2013.01); *H01L 2224/16237* (2013.01); *H01L 2224/32225* (2013.01); *H01L 2224/73204* (2013.01); *H01L 2224/73267* (2013.01); *H01L 2224/96* (2013.01); *H01L 2924/00014* (2013.01); *H01L 2924/014* (2013.01); *H01L 2924/15311* (2013.01); *H01L 2924/3511* (2013.01); *H01L 2924/37001* (2013.01); *H05K 1/0271* (2013.01); *H05K 3/4682* (2013.01); *H05K 3/4694* (2013.01); *H05K 2201/10674* (2013.01); *Y10T 29/4913* (2015.01); *Y10T 29/49146* (2015.01); *Y10T 29/49165* (2015.01)

(58) Field of Classification Search
CPC ......... H01L 23/49822; H01L 23/49827; H01L 23/5389; H01L 24/19; H01L 24/20; H01L 2224/04105; H01L 2224/131; H01L 2224/16225; H01L 2224/16237; H01L 2224/32225; H01L 2224/73204; H01L 2224/73267; H01L 2224/96; H01L 2924/00014; H01L 2924/014; H01L 2924/15311; H01L 2924/3511; H01L 2924/37001; H01L 23/147; H01L 23/15; H01L 23/36; H01L 23/49838; H01L 23/49894; H01L 23/145; H01L 2221/68345; H01L 2221/68359; H05K 3/4682; H05K 3/4038; H05K 3/4673; H05K 3/4694; H05K 2201/10674; H05K 1/11; H05K 1/112; H05K 1/142; H05K 1/183; H05K 1/0271; Y10T 29/4913; Y10T 29/49165

See application file for complete search history.

(56) References Cited

U.S. PATENT DOCUMENTS

| 7,507,915 | B2 | 3/2009 | Chang et al. | |
|---|---|---|---|---|
| 8,269,332 | B2 | 9/2012 | Sugino et al. | |
| 2007/0035015 | A1 | 2/2007 | Hsu | |
| 2009/0039523 | A1 | 2/2009 | Jiang et al. | |
| 2011/0042128 | A1* | 2/2011 | Hsu | H05K 3/4682 174/257 |
| 2014/0233199 | A1 | 8/2014 | Munakata et al. | |

\* cited by examiner

MANUFACTURING METHOD OF PACKAGE STRUCTURE

CROSS-REFERENCE TO RELATED APPLICATION

This application is a divisional of U.S. application Ser. No. 15/701,435, filed Sep. 11, 2017, now pending, which is a continuation-in-part of U.S. application Ser. No. 15/391,861, filed Dec. 28, 2016, now pending, which is a continuation-in-part of U.S. application Ser. No. 14/602,656, filed Jan. 22, 2015, now patented as U.S. Pat. No. 9,781,843, which is a divisional of U.S. application Ser. No. 13/604,968, filed Sep. 6, 2012, now patented as U.S. Pat. No. 8,946,564.

The prior U.S. application Ser. No. 15/391,861 claims priority to Taiwan Application serial number 105133848, filed Oct. 20, 2016. The prior U.S. application Ser. No. 13/604,968 claims priority to Taiwan Application serial number 100139667, filed Oct. 31, 2011. This application also claims priority to Taiwan Application Serial Number 106123710, filed Jul. 14, 2017. The entirety of each of the above-mentioned patent applications is hereby incorporated by reference herein and made a part of this specification.

BACKGROUND

Technical Field

The present disclosure relates to a manufacturing method of package structure.

Description of Related Art

As the technology of semiconductor packaging advances, there have been various types of packages for semiconductor devices developed besides the conventional wire bonding semiconductor packaging technique. For example, one type of semiconductor devices allows a semiconductor chip having an integrated circuit (IC) to be embedded in and electrically integrated with a package substrate. This semiconductor device may desirably reduce the overall size and improve the electrical functionality thereof.

In order to satisfy the demands of shortening the length of conductive wires, reducing structure thickness, and responding to the trends of high-frequency and miniaturization, a method of processing a chip embedded substrate on a coreless carrier has been developed. However, since the coreless carrier lacks the support of a hard core board, it typically results in an insufficient strength and warpage of the overall structure may easily be caused.

SUMMARY

An aspect of the disclosure is to provide a package structure and a manufacturing method thereof to solve the foregoing problems.

To achieve the foregoing purpose, according to one embodiment of the disclosure, a package structure includes a metal layer, a composite layer of a non-conductor inorganic material and an organic material, a sealant, a chip, a circuit layer structure, and an insulating protective layer. The composite layer of the non-conductor inorganic material and the organic material is disposed on the metal layer. The sealant is bonded on the composite layer of the non-conductor inorganic material and the organic material. The chip is embedded in the sealant, and the chip has electrode pads. The electrode pads are exposed from the sealant. The circuit layer structure is formed on the sealant and the chip. The circuit layer structure includes at least one dielectric layer and at least one circuit layer. The dielectric layer has conductive blind holes. The circuit layer is located on the dielectric layer and extends into the conductive blind holes. The bottommost circuit layer is electrically connected to the electrode pads through the conductive blind holes. The insulating protective layer is formed on the circuit layer structure. The insulating protective layer has openings, so as to expose parts of the surface of the circuit layer structure in the openings.

In one or more embodiments of the disclosure, the chip has a chip bottom surface exposed from the sealant.

In one or more embodiments of the disclosure, the material of the composite layer of the non-conductor inorganic material and the organic material includes a composite material composed of a ceramic material and a polymer material.

In one or more embodiments of the disclosure, the ceramic material comprises zirconia, aluminum oxide, silicon nitride, silicon carbide, silicon oxide, or a combination thereof, and the polymer material comprises epoxy resins, polyimide, liquid crystal polymers, methacrylate resins, vinyl phenyl resins, allyl resins, polyacrylate resins, polyether resins, polyolefin resins, polyamide resins, polysiloxane resins, or a combination thereof.

In one or more embodiments of the disclosure, the composite layer of the non-conductor inorganic material and the organic material is an imitation nacreous layer.

According to another embodiment of the disclosure, a method of manufacturing package structures includes the following steps: providing a carrier, in which the carrier includes a supporting layer having opposite two surfaces, a release layer disposed on each of the two surfaces, and a metal layer disposed on each of the release layers; disposing a composite layer of a non-conductor inorganic material and an organic material on each of the metal layers; bonding a chip embedded substrate on each of the composite layers of the non-conductor inorganic material and the organic material, in which the chip embedded substrate includes a plurality of chips and a sealant, the chips are embedded in the sealant, each of the chips has a plurality of electrode pads, and the electrode pads are exposed from the sealant; forming a circuit layer structure on each of the chip embedded substrates, in which the circuit layer structure includes at least one dielectric layer and at least one circuit layer, the dielectric layer has a plurality of conductive blind holes, the circuit layer is located on the dielectric layer and extends into the conductive blind holes, and the bottommost circuit layer is electrically connected to the electrode pads through the conductive blind holes; forming an insulating protective layer on each of the circuit layer structures, in which the insulating protective layer has a plurality of openings, so as to expose parts of the surface of the circuit layer structure in the openings; removing the supporting layer and the release layers to form two package substrates; and cutting each of the package substrates to obtain a plurality of package structures.

In one or more embodiments of the disclosure, each of the sealant has a sealant bottom surface, and each of the chips has a chip bottom surface. The step of bonding the chip embedded substrate on each of the composite layers of the non-conductor inorganic material and the organic material includes the following steps: grinding the sealant bottom surface to expose the chip bottom surface, so as to form a ground chip embedded substrate; and bonding the ground chip embedded substrate on each of the composite layers of the non-conductor inorganic material and the organic material.

In one or more embodiments of the disclosure, the material of the composite layer of the non-conductor inorganic material and the organic material includes a composite material composed of a ceramic material and a polymer material.

In one or more embodiments of the disclosure, the ceramic material comprises zirconia, aluminum oxide, silicon nitride, silicon carbide, silicon oxide, or a combination thereof, and the polymer material comprises epoxy resins, polyimide, liquid crystal polymers, methacrylate resins, vinyl phenyl resins, allyl resins, polyacrylate resins, polyether resins, polyolefin resins, polyamide resins, polysiloxane resins, or a combination thereof.

In one or more embodiments of the disclosure, the composite layer of the non-conductor inorganic material and the organic material is an imitation nacreous layer.

Based on the above, the package structure and the manufacturing method thereof of the disclosure form the package substrate on the composite layer of the non-conductor inorganic material and the organic material. That is, the composite layer of the non-conductor inorganic material and the organic material can be regarded as a strengthened layer, which has a higher hardness compared with a normal dielectric layer and encapsulating material. Thus, the overall structural strength of the package structure and the manufacturing method thereof of the disclosure can be enhanced through the composite layer of the non-conductor inorganic material and the organic material, so as to prevent the carrier from warping, thereby improving not only the process yield, but also the reliability of the package structure.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
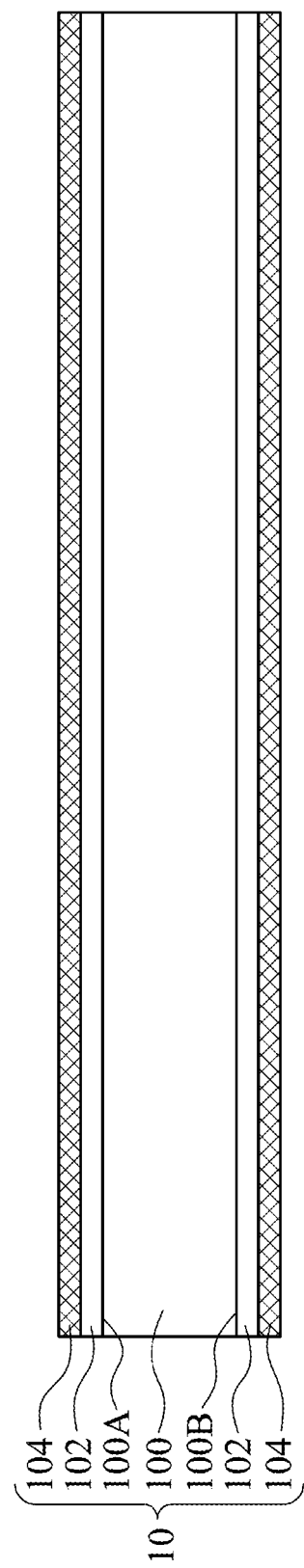
FIG. 1A to FIG. 1G are cross-sectional views illustrating the steps in a manufacturing method of a package structure according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1A to FIG. 1G are cross-sectional views illustrating the steps in a manufacturing method of a package structure 18 according to one embodiment of the disclosure. As shown in FIG. 1A, a carrier 10 is provided. Carrier 10 includes a supporting layer 100 having opposite two surfaces 100A and 100B, a release layer 102 disposed on each of the two surfaces 100A and 100B, and a metal layer 104 disposed on each of the release layers 102. In some embodiments, the material of the supporting layer 100 may be organic polymer material such as bismaleimide triazine (BT). In some embodiments, supporting layer 100 may be a copper clad laminate (CCL) (not shown) with a dielectric material (such as prepreg) formed on the opposite two surfaces 100A and 100B. In some embodiments, the release layer 102 may be a release film. In other embodiments, a copper foil bonded with a release layer as provided by companies such as Mitsui, Nippon-Denk, Furukawa or Olin can be used to provide the release layer 102. In some embodiments, the thickness of the metal layer 104 is in the range of about 1 μm to 10 μm, and the material of the metal layer 104 may be copper.

In some embodiments, additional metal layer may exist between each of the opposite two surfaces 100A and 100B of supporting layer 100 and each release layer 102. The thickness of the additional metal layer may be in the range of about 5 μm to 40 μm, and the material of the additional metal layer may be the same as or different from that of the metal layer 104, such as copper.

Figure 1B:
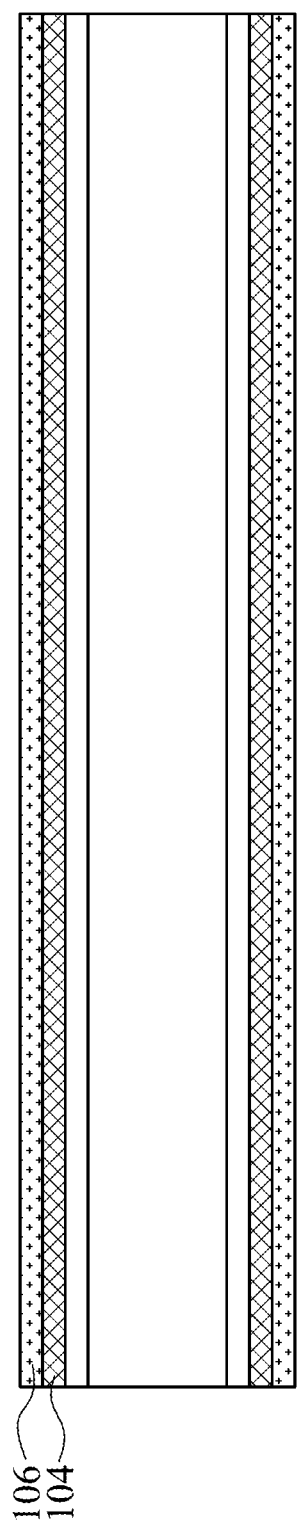

As shown in FIG. 1B, a composite layer of a non-conductor inorganic material and an organic material 106 is disposed on each of the metal layers 104.

For example, the material of the composite layer of the non-conductor inorganic material and the organic material 106 of this embodiment is a composite material composed of a ceramic material and a polymer material, for example. The ceramic material includes zirconia, aluminum oxide, silicon nitride, silicon carbide, silicon oxide, or a combination thereof, and the polymer material includes epoxy resins, polyimide, liquid crystal polymers, methacrylate resins, vinyl phenyl resins, allyl resins, polyacrylate resins, polyether resins, polyolefin resins, polyamide resins, polysiloxane resins, or a combination thereof. The ceramic material may be ceramic layers or ceramic powders, but the ceramic material of this embodiment is not limited thereto.

In the embodiment of the ceramic powders, the polymer material can be impregnated in the ceramic powders using a vacuum dipping technique in the manufacturing method of the composite layer of the non-conductor inorganic material and the organic material 106, so as to manufacture the composite layer of the non-conductor inorganic material and the organic material 106 composed of a composite material formed of the ceramic powders and the polymer material. In the embodiment that the polymer material is a photosensitive resin composition including such as an epoxy-based resin and an imide-based resin, for example, the composite layer of the non-conductor inorganic material and the organic material 106 is disposed on the metal layer 104 by hot pressing or vacuum dipping and then irradiating with ultraviolet light and heating, for example.

In the embodiment of the ceramic layers, the polymer material can be impregnated in the ceramic layers using a vacuum dipping technique in the manufacturing method of the composite layer of the non-conductor inorganic material and the organic material 106, so as to manufacture the composite layer of the non-conductor inorganic material and the organic material 106 composed of a composite material formed of the ceramic layers and the polymer material. However, the manufacturing method of the composite layer of the non-conductor inorganic material and the organic material 106 of the embodiment is not limited thereto. Other methods capable of forming the composite material from the polymer material and the ceramic material are suitable. In the embodiment of the ceramic layers, more specifically, the composite layer of the non-conductor inorganic material and the organic material 106 includes a composite composition of an organic matter and an inorganic matter (e.g., a composite composition of the polymer material and the ceramic layers). Based on the adhesion of the organic matter to the inorganic matter, the ceramic layers of the composite layer of the non-conductor inorganic material and the organic material 106 has a microscopic laminated structure in a sheet-shape, a brick-shape, or a combination thereof arrangement. The arrangement suppresses the conduction of transverse rupture forces, thereby significantly improving its hardness. Therefore, the material is strong and has flexibility, which is able to increase ceramic strength and improve ceramic brittleness, and with excellent toughness at the same time. The composite layer of the non-conductor inorganic material and the organic material 106 may be an imitation nacreous layer.

In some embodiments, a Young's modulus of the composite layer of the non-conductor inorganic material and the organic material 106 is between 20 GPa and 100 GPa, for example. Compared with a commonly used dielectric layer (with a Young's modulus not more than 10 GPa) and an encapsulating material (with a Young's modulus not more than 20 GPa), the composite layer of the non-conductor inorganic material and the organic material 106 of the embodiment has an excellent hardness, such that a structural strength of the package structure can be effectively enhanced.

Figure 1C:
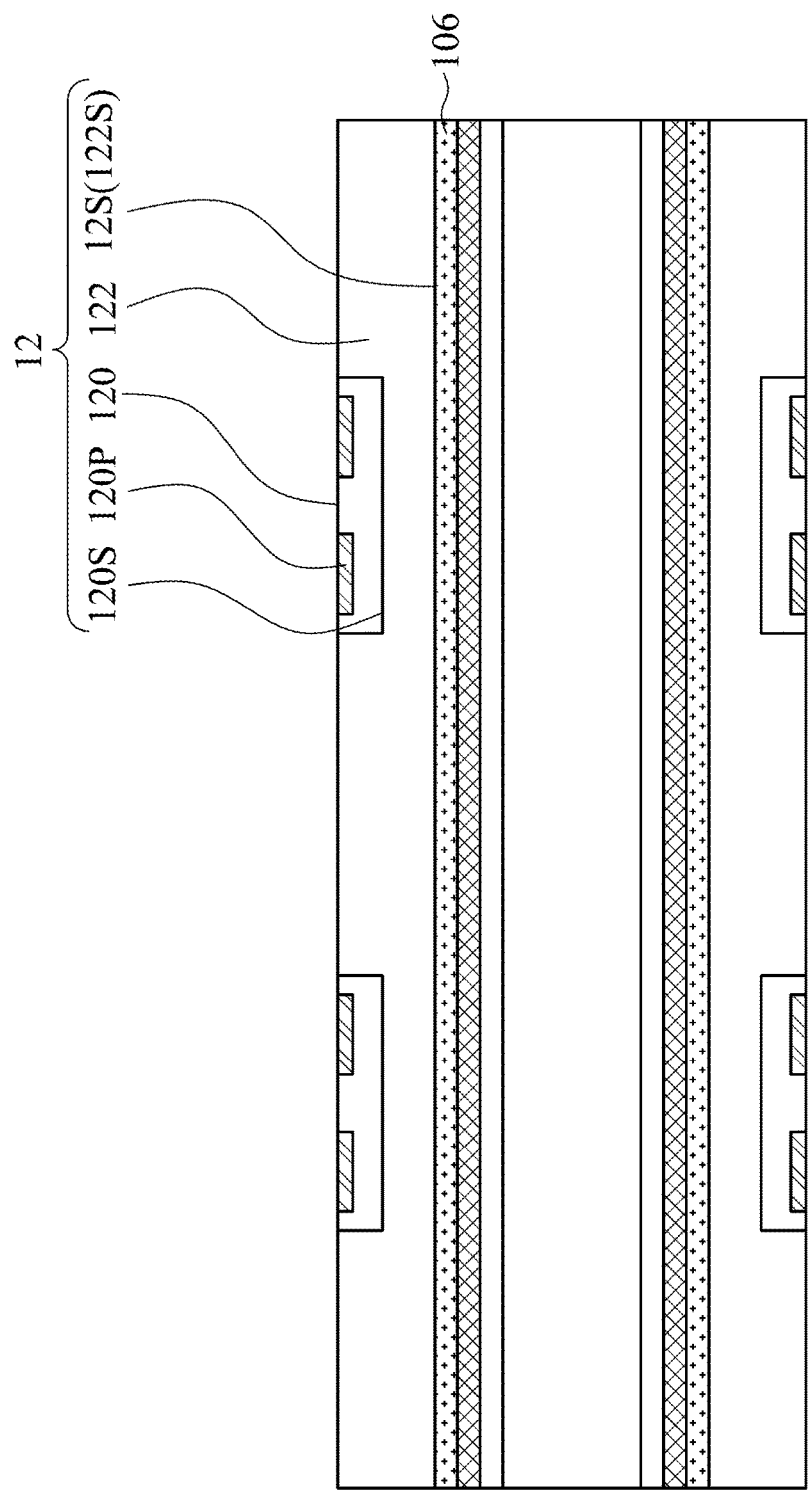

As shown in FIG. 1C, a chip embedded substrate 12 is bonded on each of the composite layers of the non-conductor inorganic material and the organic material 106. The chip embedded substrate 12 includes a plurality of chips 120 and a sealant 122. The chips 120 are embedded in the sealant 122, and each of the chips 120 has a plurality of electrode pads 120P. The electrode pads 120P are exposed from the sealant 122.

In some embodiments, an adhesive layer (not shown) may be used to bond the chip embedded substrate 12 on the composite layer of the non-conductor inorganic material and the organic material 106. Specifically, the adhesive layer can be adhered to a substrate bottom surface 12S of the chip embedded substrate 12 first, and then bond the chip embedded substrate 12 on the composite layer of the non-conductor inorganic material and the organic material 106. The adhesive layer can include thermal grease with high heat dissipation or high temperature resistance, but the disclosure is not limited thereto.

Figure 1D:
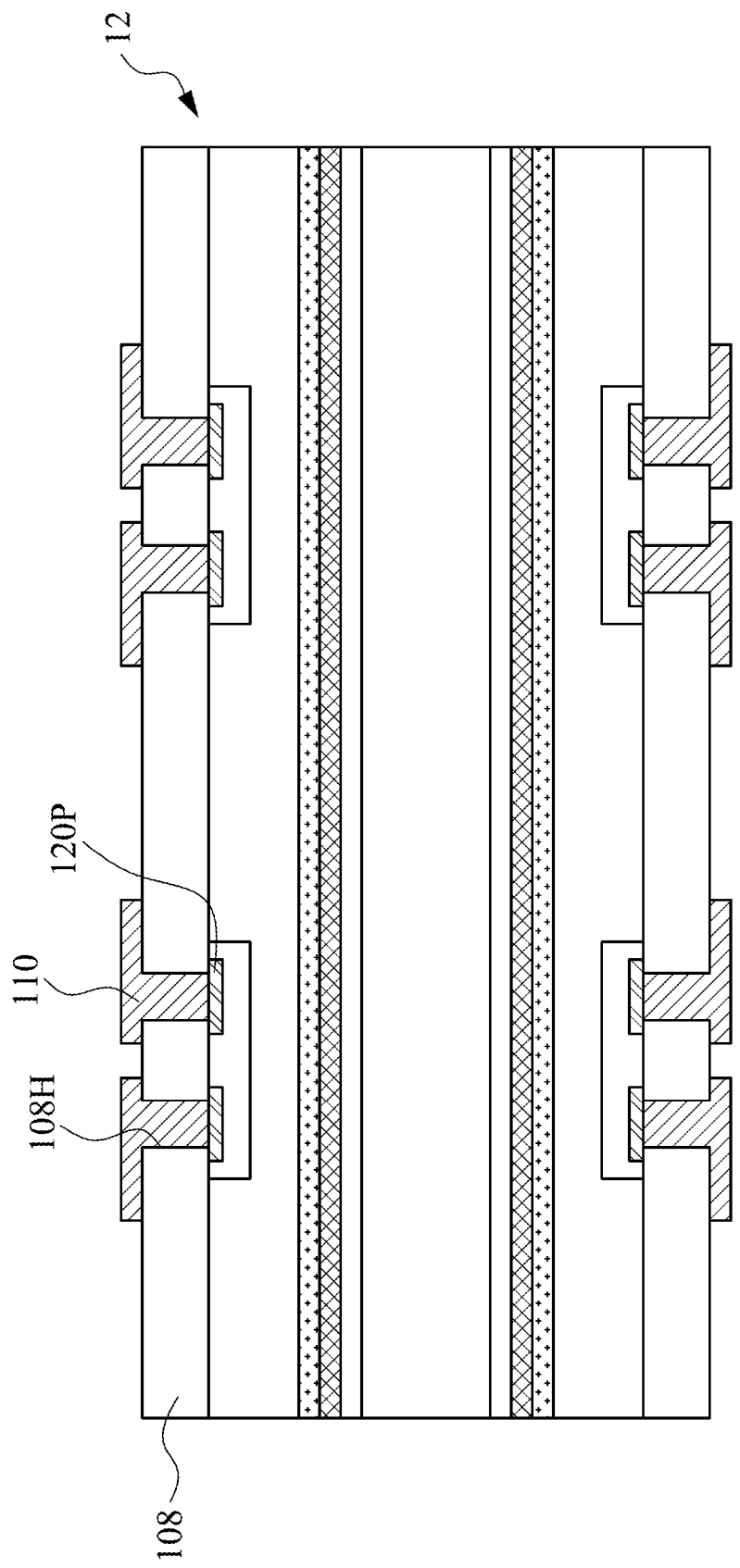
Figure 1E:
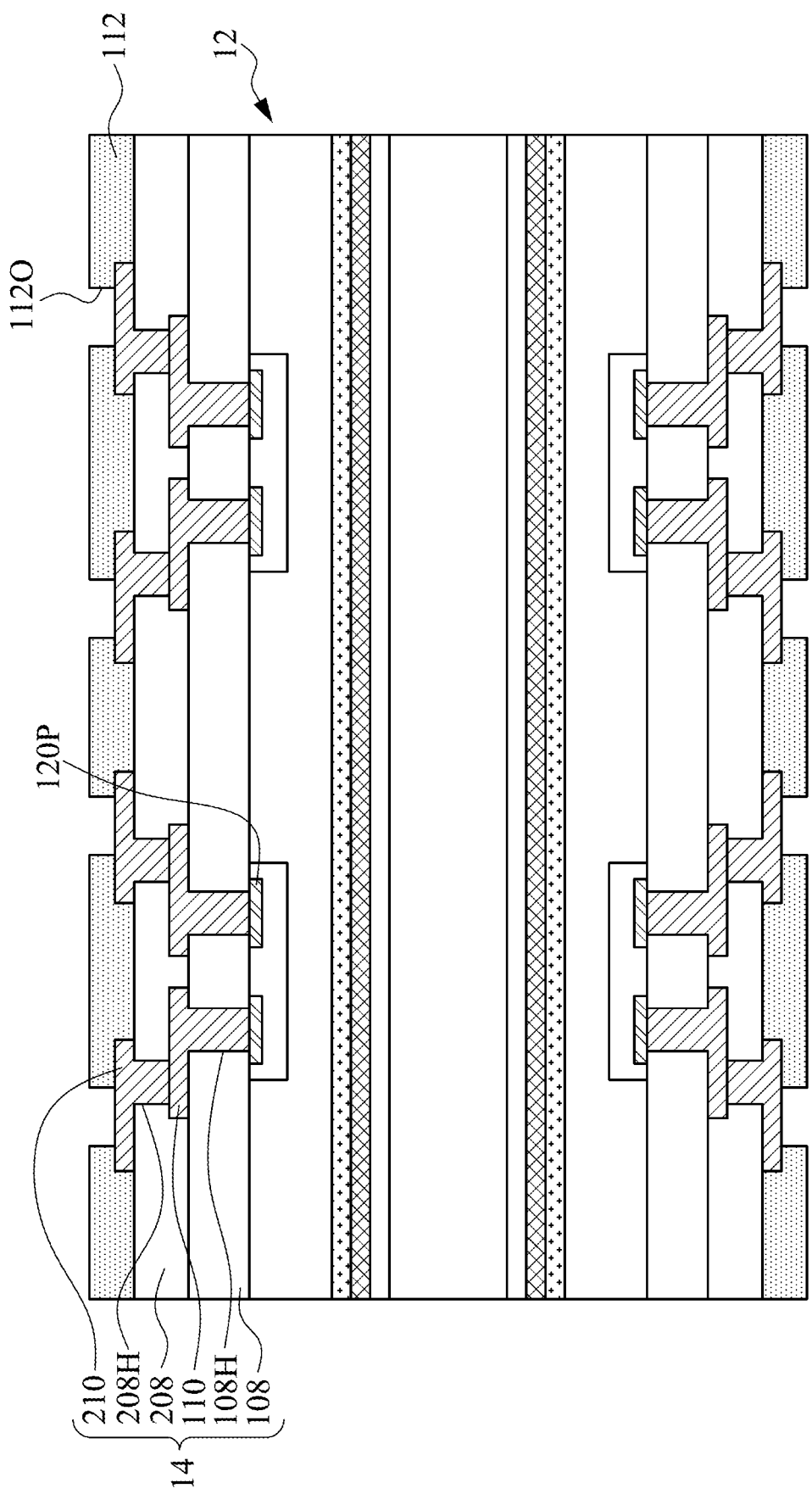

As shown in FIG. 1D to FIG. 1E, a circuit layer structure 14 is formed on each of the chip embedded substrates 12. The circuit layer structure 14 includes at least one dielectric layer and at least one circuit layer. Each dielectric layer has a plurality of conductive blind holes. Each circuit layer is located on each dielectric layer respectively, and extends into the conductive blind holes. The bottommost circuit layer is electrically connected to the electrode pads 120P through the conductive blind holes.

A basic unit of the circuit layer structure 14 is consisted of at least one dielectric layer and at least one circuit layer. A person having ordinary skill in the art may make proper modification to the number of layers of the dielectric layer and the circuit layer according to actual needs. In this embodiment, the circuit layer structure 14 will be specify in the case of including two dielectric layers (first dielectric layer 108 and second dielectric layer 208) and two circuit layers (first circuit layer 110 and second circuit layer 210) in the following descriptions.

As shown in FIG. 1D, a first dielectric layer 108 is formed on each of the chip embedded substrates 12. The first dielectric layer 108 has a plurality of first conductive blind holes 108H. In some embodiments, the material of the first dielectric layer 108 may include resin and glass fibers. The resin may be novolak resin, epoxy resin, polyimide resin, or polytetrafluoroethylene. In other embodiments, the material of the first dielectric layer 108 may include photo-imagable dielectric (PID). In some embodiments, the first dielectric layer 108 may be formed by lamination. In some embodiments, the first conductive blind holes 108H can be formed by performing a laser ablation process to the first dielectric layer 108, or using PID as the material of the first dielectric layer 108 so as to form the first conductive blind holes 108H by photolithography process, but not limited thereto.

Please continue to refer to FIG. 1D. A first circuit layer 110 is formed on each of the first dielectric layers 108. The first circuit layer 110 extends into the first conductive blind holes 108H, such that the first circuit layer 110 is electrically connected to the electrode pads 120P through the first conductive blind holes 108H. In some embodiments, the first circuit layer 110 may be formed by the following steps: forming a photoresist layer (not shown) such as a dry film on the first dielectric layer 108; performing a photolithography process to patterning the photoresist layer, so as to expose parts of the first dielectric layer 108; and performing an electroplating process and removing the photoresist layer to form the first circuit layer 110. In some embodiment, the material of the first circuit layer 110 may be copper.

In some embodiment, a seed layer may be formed on the first dielectric layer 108 before forming the first circuit layer 110. The seed layer may have a single layer structure or a multi-layer structure consisted of sub-layers having different materials, such as a metal layer consisted of a titanium layer and a copper layer located on the titanium layer. The method of forming the seed layer may include, but not limited to, physical methods such as titanium and copper sputtering, or chemical methods such as chemical palladium and copper plating, and copper electroplating.

As shown in FIG. 1E, a second dielectric layer 208 is formed on each of the first dielectric layers 108 and each of the first circuit layers 110. The second dielectric layer 208 has a plurality of second conductive blind holes 208H. A second circuit layer 210 is formed on each of the second dielectric layers 208. The second circuit layer 210 extends into the second conductive blind holes 208H, such that the second circuit layer 210 is electrically connected to the first circuit layer 110 through second conductive blind holes 208H.

Accordingly, the circuit layer structure 14 is formed on each of the chip embedded substrates 12. The circuit layer structure 14 includes the first dielectric layer 108, the first circuit layer 110, the second dielectric layer 208, and the second circuit layer 210. The first dielectric layer 108 has a plurality of the first conductive blind holes 108H, and the first circuit layer 110 is electrically connected to the electrode pads 120P through the first conductive blind holes 108H. The second dielectric layer 208 has a plurality of the second conductive blind holes 208H, and the second circuit layer 210 is electrically connected to the first circuit layer 110 through the second conductive blind holes 208H. That is, the circuit layer structure 14 includes at least one dielectric layer (first dielectric layer 108 and second dielectric layer 208) and at least one circuit layer (first circuit layer 110 and second circuit layer 210). Each dielectric layer has a plurality of conductive blind holes (first conductive blind holes 108H and second conductive blind holes 208H). Each circuit layer is located on each dielectric layer respectively, and extends into the conductive blind holes. The bottommost circuit layer (first circuit layer 110) is electrically connected to the electrode pads 120P through the conductive blind holes (first conductive blind holes 108H).

Details about the forming methods and the materials of the second dielectric layer 208, the second circuit layer 210, and the second conductive blind holes 208H may be similar to those of the first dielectric layer 108, the first circuit layer 110, and the first conductive blind holes 108H mentioned above respectively, and therefor they are not to be repeated here again. Moreover, a seed layer may also be formed on the second dielectric layer 208 before forming the second circuit layer 210 as mentioned above, and therefore it is not to be repeated here again.

Reference is made to FIG. 1E. An insulating protective layer 112 is formed on each of the circuit layer structures 14. The insulating protective layer 112 has a plurality of openings 1120, so as to expose parts of the surface of the circuit layer structure 14 in the openings 1120. Specifically, as shown in FIG. 1E, parts of the surface of the outermost second circuit layer 210 of the circuit layer structure 14 are exposed in the openings 1120.

In some embodiments, the material of the insulating protective layer 112 may be solder resist material or resin material such as epoxy resin. In other embodiments, the material of the insulating protective layer 112 may also be the same as above-mentioned material of the first dielectric layer 108 or second dielectric layer 208. The insulating protective layer 112 may be formed by laminating, printing, or coating.

Figure 1F:
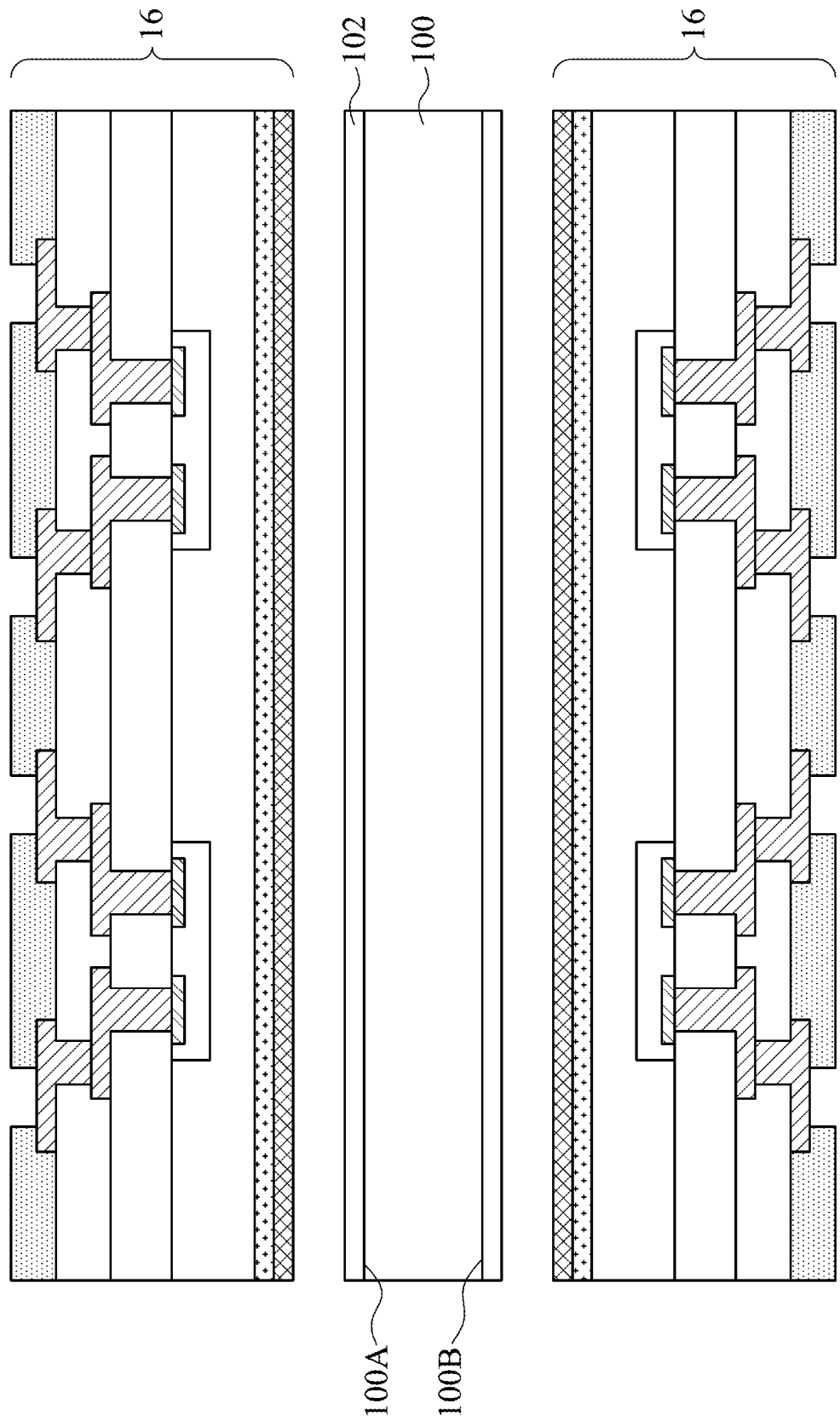

As shown on FIG. 1F, the supporting layer 100 and the release layers 102 are removed to form two package substrates 16. Therefore, compared to conventional one-side manufacturing method, which easily causes the warpage because of its structural asymmetry, this embodiment provides the same processes on the opposite two surfaces 100A and 100B of the supporting layer 100 respectively at the same time to form up-down symmetrical two package substrates 16, so as to prevent the supporting layer 100 from warping phenomenon, and improve the reliability of the overall package structure.

Figure 1G:
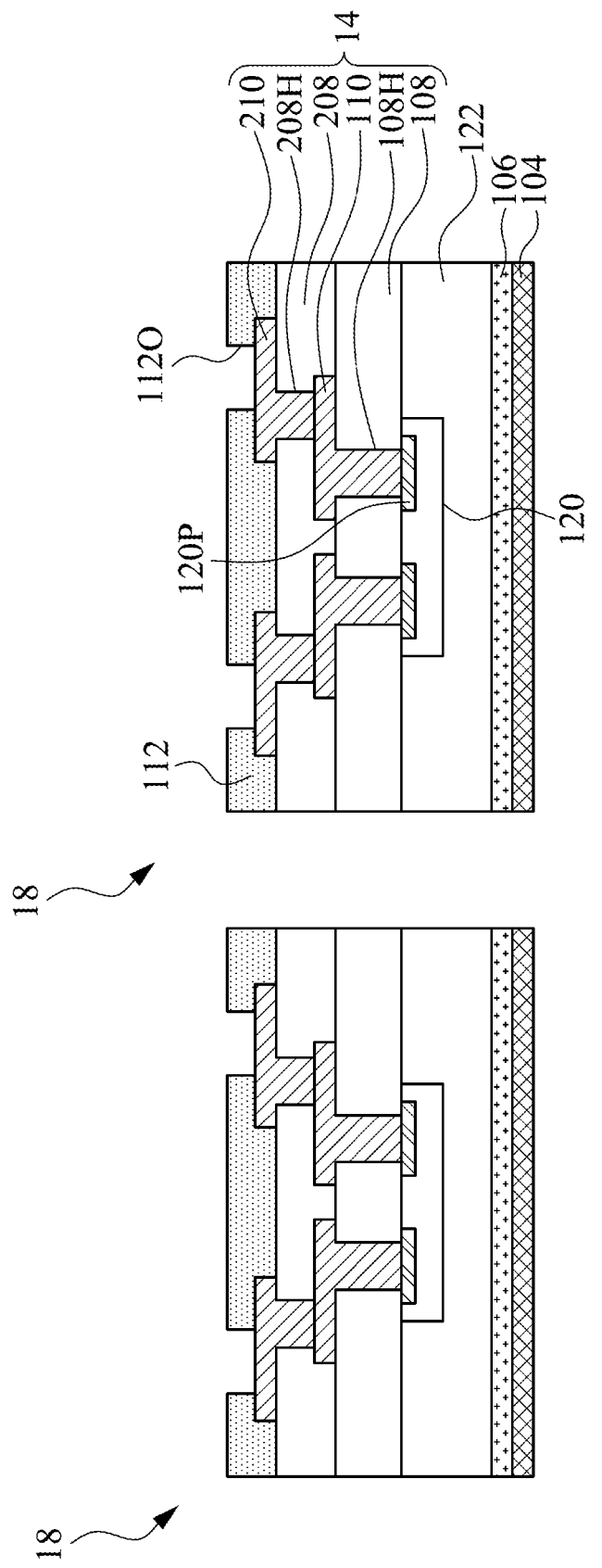

Lastly, as shown in FIG. 1G, each of the package substrates 16 is cut to obtain a plurality of package structures 18. Thus, if each package substrate 16 can produce N package structures 18, the two package substrates 16 manufactured through FIG. 1A to FIG. 1F can produce 2N package structures 18, and thereby the process yield can be improved significantly.

Accordingly, the package structure 18 according to this embodiment is obtained. The package structure 18 includes the metal layer 104, the composite layer of the non-conductor inorganic material and the organic material 106, the sealant 122, the chip 120, the circuit layer structure 14, and the insulating protective layer 112. The composite layer of the non-conductor inorganic material and the organic material 106 is disposed on the metal layer 104. The sealant 122 is bonded on the composite layer of the non-conductor inorganic material and the organic material 106. The chip 120 is embedded in the sealant 122. The chip 120 has a plurality of electrode pads 120P, and the electrode pads 120P are exposed from the sealant 122. The circuit layer structure 14 is formed on the sealant 122 and the chip 120. The circuit layer structure 14 includes at least one dielectric layer and at least one circuit layer. Each dielectric layer has a plurality of conductive blind holes. Each circuit layer is located on each dielectric layer respectively, and extends into the conductive blind holes. The bottommost circuit layer is electrically connected to the electrode pads 120P through the conductive blind holes. An insulating protective layer 112 is formed on the circuit layer structure 14. The insulating protective layer 112 has a plurality of openings 1120, so as to expose parts of the surface of the circuit layer structure 14 in the openings 1120.

According to the package structure 18 and the manufacturing method thereof provided in the disclosure, the package substrate 16 is formed on the composite layer of the non-conductor inorganic material and the organic material 106. That is, the composite layer of the non-conductor inorganic material and the organic material 106 can be regarded as a strengthened layer, which has a higher hardness compared with a normal dielectric layer and encapsulating material. Thus, the overall structural strength of the package structure 18 and the manufacturing method thereof of the disclosure can be enhanced through the composite layer of the non-conductor inorganic material and the organic material 106, so as to prevent the carrier from warping phenomenon, thereby improving not only the process yield, but also the reliability of the package structure 18.

Moreover, since the package structure 18 has the metal layer 104 in the bottom, the heat generated by the chip 120 can be dissipated by the metal layer 104 to achieve an effect of heat dissipation.

Figure 2A:
FIG. 2A to FIG. 2B are cross-sectional views illustrating some steps in a manufacturing method of a package structure according to another embodiment of the disclosure.
Figure 2B:
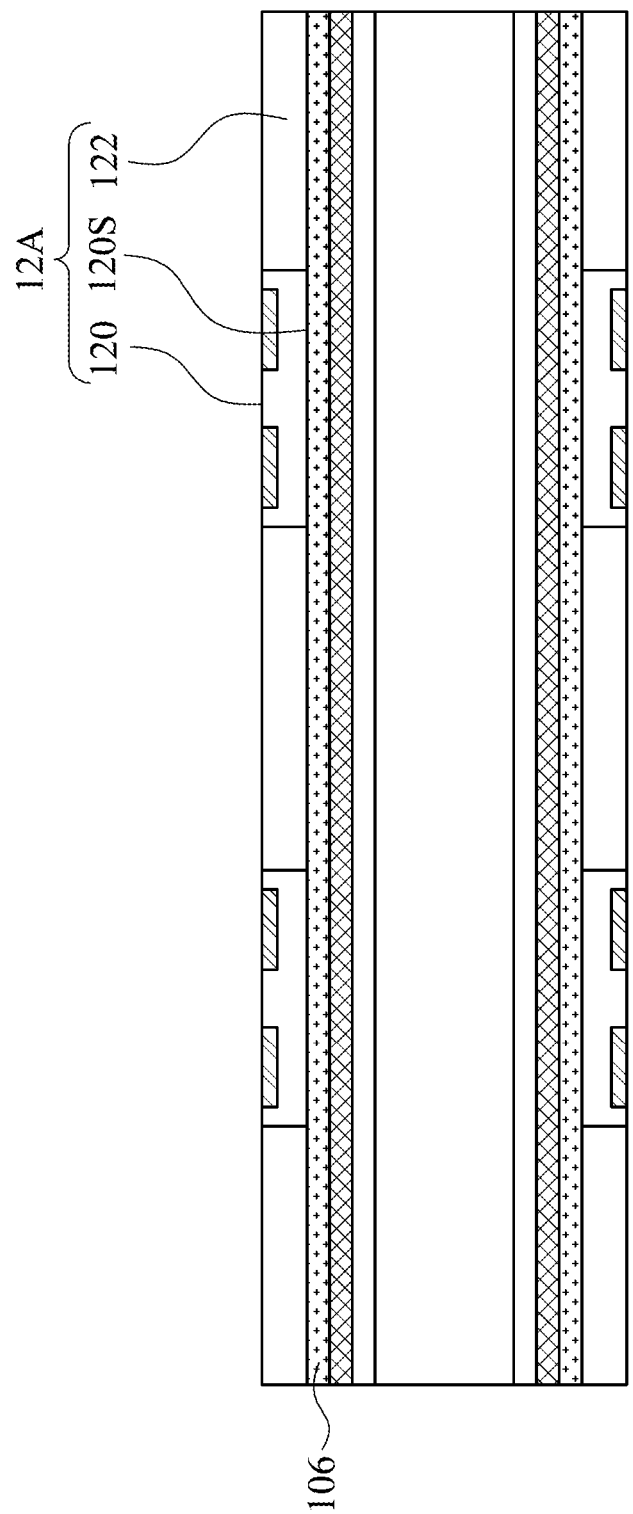
Figure 3:
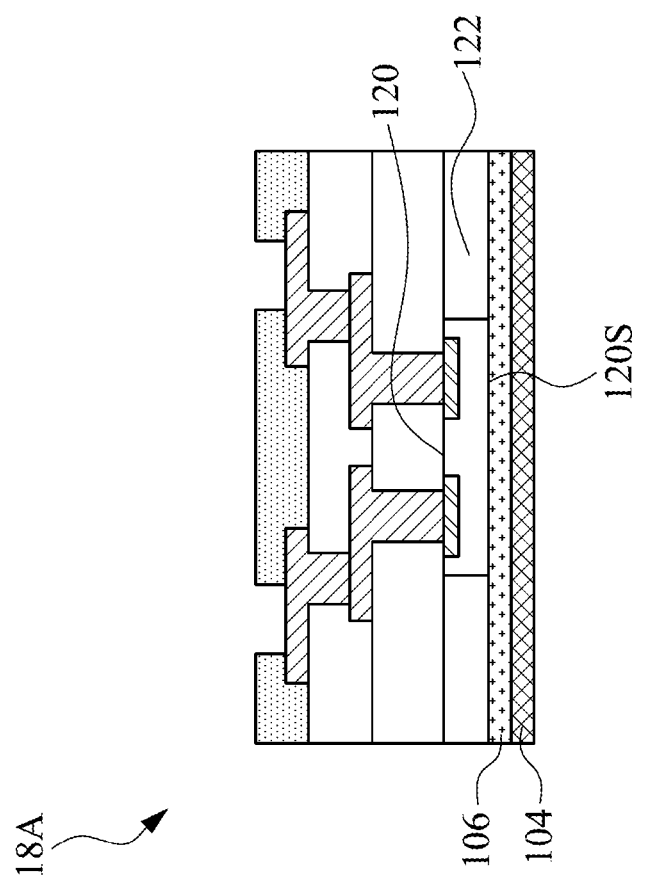
FIG. 3 is a cross-sectional view illustrating the package structure obtained by the manufacturing method according to FIG. 2A to FIG. 2B.

FIG. 2A to FIG. 2B are cross-sectional views illustrating some steps in a manufacturing method of a package structure 18A according to another embodiment of the disclosure. FIG. 3 is a cross-sectional view illustrating the package structure 18A obtained by the manufacturing method according to FIG. 2A to FIG. 2B. The method of manufacturing package structure 18A according to this embodiment is similar to the method of manufacturing the package structure 18 as mentioned above, and the difference is that in this embodiment, the step of bonding the chip embedded substrate 12 on each of the composite layers of the non-conductor inorganic material and the organic material 106 further includes the following sub-step: grinding a sealant bottom surface 122S to expose a chip bottom surface 120S.

Please refer to FIG. 2A and FIG. 1C at the same time. The difference between this embodiment and the step shown in FIG. 1C is that a sealant bottom surface 122S is ground to expose a chip bottom surface 120S, so as to form a ground chip embedded substrate 12A before bonding the chip embedded substrate 12 on each of the composite layers of the non-conductor inorganic material and the organic material 106. In some embodiment, the method of grinding the sealant bottom surface 122S may be chemical-mechanical polishing (CMP).

As shown in FIG. 2B, the ground chip embedded substrate 12A is bonded on each of the composite layers of the non-conductor inorganic material and the organic material 106. That is, when the ground chip embedded substrate 12A is bonded on the composite layer of the non-conductor inorganic material and the organic material 106, the chip bottom surface 120S is exposed from the sealant 122.

In some embodiments, an adhesive layer (not shown) may be used herein to bond the ground chip embedded substrate 12A on each of the composite layers of the non-conductor inorganic material and the organic material 106 as above-mentioned embodiment, and therefore it is not to be repeated here again.

Then, continue the steps in FIG. 1D to FIG. 1G, and the package structure 18A as shown in FIG. 3 is accordingly obtained. In this embodiment, since the chip bottom surface 120S is exposed from the sealant 122, the heat generated by the chip 120 can be dissipated by the metal layer 104 more effectively thereby to further improve the effect of heat dissipation. Moreover, the thickness of the package structure 18A is also reduced, which is beneficial to the miniaturization of products.

According to the foregoing recitations of the embodiments of the disclosure, it can be seen that the package structure and the manufacturing method thereof of the disclosure form the package substrate on the composite layer of the non-conductor inorganic material and the organic material. That is, the composite layer of the non-conductor inorganic material and the organic material can be regarded as a strengthened layer, which has a higher hardness compared with a normal dielectric layer and encapsulating material. Thus, the overall structural strength of the package structure and the manufacturing method thereof of the disclosure can be enhanced through the composite layer of the non-conductor inorganic material and the organic material, so as to prevent the carrier from warping phenomenon, thereby improving not only the process yield, but also the reliability of the package structure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing package structures, comprising:

providing a carrier, wherein the carrier comprises a supporting layer having opposite two surfaces, a release layer disposed on each of the two surfaces, and a metal layer disposed on each of the release layers;

disposing a composite layer of a non-conductor inorganic material and an organic material on each of the metal layers;

bonding a chip embedded substrate on each of the composite layers of the non-conductor inorganic material and the organic material, wherein the chip embedded substrate comprises a plurality of chips and a sealant, the chips are embedded in the sealant, each of the chips has a plurality of electrode pads, and the electrode pads are exposed from the sealant;

forming a circuit layer structure on each of the chip embedded substrates, wherein each of the circuit layer structures comprises at least one dielectric layer and at least one circuit layer, the at least one dielectric layer has a plurality of conductive blind holes, the at least one circuit layer is located on the at least one dielectric layer and extends into the conductive blind holes, and a bottommost circuit layer is electrically connected to the electrode pads through the conductive blind holes;

forming an insulating protective layer on each of the circuit layer structures, wherein the insulating protective layer has a plurality of openings, so as to expose parts of a surface of the circuit layer structure in the openings;

removing each of the supporting layers and each of the release layers to form two package substrates; and cutting each of the package substrates to obtain a plurality of the package structures.

2. The method of claim 1, wherein each of the sealants has a sealant bottom surface, and each of the chips has a chip bottom surface, wherein the step of bonding the chip embedded substrate on each of the composite layers of the non-conductor inorganic material and the organic material comprises:

grinding the sealant bottom surface to expose the chip bottom surface, so as to form a ground chip embedded substrate; and bonding the ground chip embedded substrate on each of the composite layers of the non-conductor inorganic material and the organic material.

3. The method of claim 1, wherein a material of each of the composite layers of the non-conductor inorganic material and the organic material comprises a composite material composed of a ceramic material and a polymer material.

4. The method of claim 3, wherein the ceramic material comprises zirconia, aluminum oxide, silicon nitride, silicon carbide, silicon oxide, or a combination thereof, and the polymer material comprises epoxy resins, polyimide, liquid crystal polymers, methacrylate resins, vinyl phenyl resins, allyl resins, polyacrylate resins, polyether resins, polyolefin resins, polyamide resins, polysiloxane resins, or a combination thereof.

5. The method of claim 1, wherein each of the composite layers of the non-conductor inorganic material and the organic material is an imitation nacreous layer.

* * * * *